United States Patent [19]

Molen et al.

[11] 4,406,952

[45] Sep. 27, 1983

[54] OPENING SWITCH FOR INTERRUPTING CURRENT USING A PLASMA FOCUS DEVICE

[76] Inventors: George M. Molen, 5327 Rolfe Ave., Norfolk, Va. 23508; James L. Cox, Jr., 905 Bentley Heath Common, Virginia Beach, Va. 23452

[21] Appl. No.: 337,761

[22] Filed: Jan. 7, 1982

[51] Int. Cl.³ .................. H01F 27/42; H03K 3/86
[52] U.S. Cl. ............................ 307/104; 328/67
[58] Field of Search ............ 307/104; 328/67, 125; 361/153; 315/289

[56] References Cited

U.S. PATENT DOCUMENTS

| | | | |
|---|---|---|---|
| 2,761,998 | 9/1956 | Chen | 361/153 |
| 2,830,178 | 4/1958 | White | 328/67 X |
| 3,171,040 | 2/1965 | Goebel | 328/67 X |
| 3,936,706 | 2/1976 | Hamstra | 361/153 |
| 4,185,244 | 1/1980 | Weiner | 328/67 |

*Primary Examiner*—Donald A. Griffin
*Attorney, Agent, or Firm*—Oblon, Fisher, Spivak, McClelland & Maier

[57] ABSTRACT

An opening switch device for interrupting the flow of high amperage currents such as those which occur in inductive energy storage systems is disclosed. The opening switch includes a plasma focus device incorporating an auxiliary electrode through which the current to be interrupted flows. This current is interrupted due to the enhanced resistance which occurs in the plasma focus device. A second embodiment of the plasma focus switch includes the application of an external magnetic field which is compressed by the plasma focus effect along with the current flowing through the auxiliary electrode.

24 Claims, 6 Drawing Figures

OPENING SWITCH FOR INTERRUPTING CURRENT USING A PLASMA FOCUS DEVICE

BACKGROUND OF THE INVENTION

1. Field of the Invention

The present invention relates, in general, to a novel opening switch device for interrupting the flow of high amperage currents such as those which occur in inductive energy storage systems. The opening switch includes a novel plasma focus device incorporating an auxiliary electrode through which the current to be interrupted flows. This current is interrupted due to current pinching caused by the plasma focus discharge.

2. Description of the Prior Art

The present requirements for pulsed power loads such as high-energy lasers and particle-beam accelerators are for instantaneous powers that far exceed the capabilities of most continuous-duty power systems. A practical alternative is the employment of energy storage and power conditioning networks that compress energy, i.e., that store energy over comparatively long periods of time and then discharge the energy in a time interval appropriate for the load. It is thus possible to obtain tremendous amplification of the power that is supplied to the load. Ideally, the discharge time should be independent of the time required to charge the storage element. Capacitive, inductive, chemical, and inertial energy storage mechanisms have all been considered as possible energy storage techniques.

The pulsed loads of interest involve discharge times of tens of microseconds or less such that capacitive and inductive energy storage are the only viable storage methods available. As the magnetic energy density, $B \cdot H/2$, can be approximately 100 to 1,000 times greater than the electrostatic energy density, $D \cdot E/2$, for realistic values of electric and magnetic fields, inductive energy storage is a far more practical method of storing energy. For large systems, inductive energy storage can represent a significant difference in physical size, system efficiency, and operational convenience. Thus inductive energy storage is an alternative technique for temporarily storing large quantities of electric energy, such as energy levels in excess of 100 kJ. The attractiveness of inductive energy storage has been further enhanced by recent improvements in the technology of large inertial energy storage devices, such as homopolar generators, which are almost ideal current sources for such inductive networks.

While the electrical circuitry used in inductive energy storage is admittedly simple, progress in the development of such systems has been limited by the requirement for an opening switch which can interrupt an inductive charging current in the range of tens of kiloamperes to perhaps megamperes.

Figure 1:
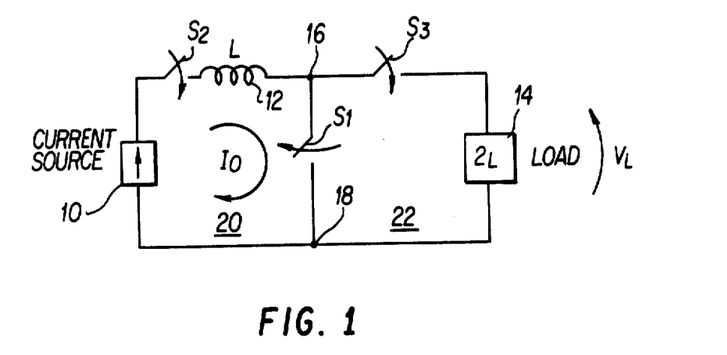
FIG. 1 is a schematic representation of an inductive energy storage system.

FIG. 1 illustrates a typical circuit for an inductive energy storage system. In FIG. 1, a low-voltage, high current source 10, such as a homopolar generator, is connected in series with an inductor 12 having an inductance L through switches $S_1$ and $S_2$ to form a charging circuit 20. An output circuit 22 including a load 14 having an impedance $Z_L$ in series with switch $S_3$ is joined to the charging circuit 20 across switch $S_1$ at junctions 16 and 18. The system first operates to charge the inductor by causing the current to build up in the charging circuit 20. For efficient operation, the current passing through the inductor must be built up in a time less than the L/R time constant of the inductor. If switch $S_1$ is initially closed, a current I will finally be established in the inductor sometime after the switch $S_2$ is closed. The energy in the coil ($\frac{1}{2}LI^2$) must then be transferred to the load 14 in the form of a pulse. This occurs when switch $S_3$ is closed and switch $S_1$ is simultaneously opened. At that instant the peak output voltage will approach $IR_L$ for the load 14 where a resistive load is assumed such that $Z_L = R_L$. Eventually the voltage pulse will decay with a time constant of $L/R_L$. It is the last state, namely the opening of switch $S_1$, that represents the greatest obstacle in the operation of this circuit.

Figure 2:
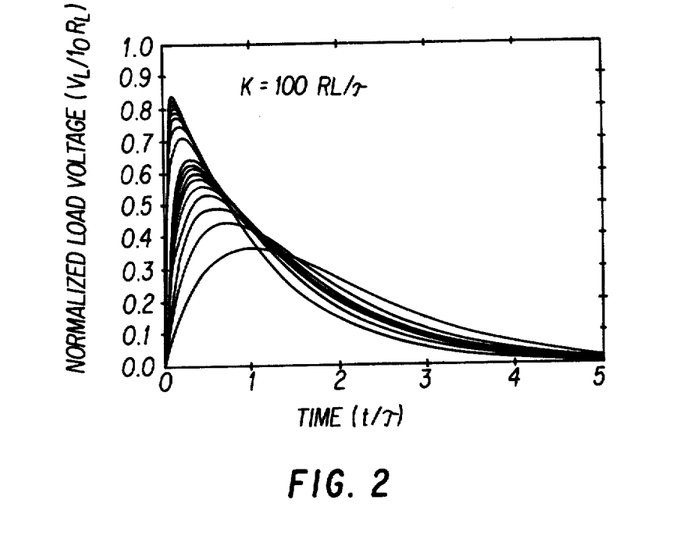
FIG. 2 is a graph illustrating the relationship between the normalized load voltage and time for various switching rates for an inductive energy storage system.

Numerous circuit analyses of inductive energy storage systems have been conducted. The work of Trost et al repeated in the Proceedings Of The First International Pulsed Power Conference, IEEE Pub. No. 76 CH 1147-8REG05, November 1976 is particularly pertinent to the present discussion. In FIG. 2, the results of computations by Trost et al are shown of the temporal characteristics of a voltage pulse applied to a resistive load. The resistance, $R_S$, of the opening switch $S_1$ is assumed to increase linearly with time such that $R_S = kt$. In this analysis the "opening time" is defined to be the time necessary for the switch resistance to equal the load resistance. In this figure the normalized output voltage across the load is shown as k varies from $R_L/\tau$ to $100\ R_L/\tau$. It should be noted that the peak voltage across the load increases as the switching time is reduced relative to $L/R_L$. For this example, approximately 82 percent of $IR_L$ will appear across $R_L$ for $k = 100\ R_L/\tau$. This clearly depicts the significance of rapidly interrupting the current in the charging branch. The remainder of the pulse is a simple exponential decay with a time constant equal to $L/R_L$.

Although commercial interrupters, such as vacuum bottles, exist for 60-Hz applications, these devices are not usually adequate for QUASI-DC since the current does not go to zero periodically. Moreover, typical applications for the switches necessary for use in inductive energy storage systems involve currents in the tens to hundreds of kiloamperes and load voltages of hundreds of kilovolts to perhaps megavolts. The problem is often compounded by the need for repetitive switching.

The requirements for an opening switch that would have a significant impact on the state-of-the-art in pulsed inductive energy storage are:

(1) Fast opening time (much less than $L/R_L$);
(2) Low loss in the closed state;
(3) High impedance in the open state relative to the impedance of the load;
(4) High current capabilities without significant erosion;
(5) High restrike voltage with a rapid recovery rate;
(6) A nondestructive switch that can be repetitively pulsed.

Several devices are currently being investigated as opening switches, and they can be divided into two general groups. The first group employs a mechanical disruption of the conductors such as by physically separating the electrodes (circuit breaker) or by cutting the conductors with explosives. The second group relies on some mechanism to increase the resistivity of the medium, either by heating or by the use of magnetic or electric fields. A major disadvantage of these prior art methods is that a single switch usually is not able to provide a sufficiently large change in resistance to satisfy the needs of inductive storage systems. For many of these switches, such as fuses, th conduction time is also rather limited. Also, many of these devices are incapable of providing reasonable repetition rates or in fact any repetition at all, as in the case of the fuse or explosive type switches. The solution to many of these deficiencies has been the construction of arrays of switching elements; however, this obviously increases the complexity and cost of the switching devices.

In recent years plasma devices have been considered as possible opening switches. One particularly interesting device is called a plasma focus. A plasma focus device is a coaxial, plasma accelerator in which magnetic energy stored in the coaxial geometry and internal circuit of the device is rapidly converted to plasma energy as an azimuthally symmetric current sheath collapses to form a densely compressed focused plasma. The collapse, which can be considered as a two-dimensional z-pinch, produces a hot, dense plasma with a radius on the order of 1 mm. At peak compression, an anomalous resistivity occurs in the plasma as indicated by an abrupt decrease in the plasma focus current. Decreases in the current by as much as 50 percent can occur in time intervals of tens of nanoseconds. Since the peak discharge current in a rather modest size plasma focus (e.g., 34 kJ) can easily exceed 600 kA, this represents a potentially exciting device for use as an interrupting switch. It is also important to note that bursts of electrons and ions with energies as large as 1 MeV are produced in the hot dense plasma coincident with the sharp decrease in plasma focus current. The particles stream out along the axis of the system are believed to be accelerated by strong electric fields generated in the hot plasma. Electron bursts with currents exceeding 30 kA have been reported.

Several researchers have recognized the potential of the plasma focus device as an interrupting switch in configurations for which the energy is stored as magnetic energy in the focus or in an external inductance which is inserted in series with the capacitors which drive the device. There are three fundamental limitations to this rather direct approach:

(1) the inductance of the device is limited to values of tens of nanohenries which severly restricts the magnetic energy stored;
(2) the time available to charge the inductor is limited to approximately 1 to 10 microseconds; and
(3) a maximum of approximately 50 percent of the discharge current can be interrupted.

The second limitation is perhaps the greatest obstacle as this limits the maximum energy compression that can be achieved.

The inventors of the present invention have developed an inductive energy storage system utilizing plasma focus theory which does not suffer from the above discussed limitations. A novel modified plasma focus device is utilized in the present invention to provide the interrupting capability, while maintaining the inductive energy storage circuit separate from the switching means. This enables the charging time to be independent of the interrupting characteristics. Thus large energy compression ratios can be achieved.

Applications for the invention other than in inductive energy storage circuits are also feasible. There are currently applications in the electrical utility industry for a switch to interrupt currents in high-voltage dc transmission circuits. Such currents are particularly difficult to interrupt by conventional means as the current never goes through a natural current zero. The switch would be utilized in such applications by placing the plasma focus switch in series with the high-voltage transmission line at the location where it is desired to interrupt the current. This would entail connecting to points 16 and 18 in FIG. 1 and omitting the inductive charging circuit 20 and the load circuit 22.

SUMMARY OF THE INVENTION

Accordingly, one object of the present invention is to provide a novel opening switch for use in interrupting large currents which occur in inductive energy storage systems.

Other objects of the present invention are to provide a novel opening switch having the following advantageous features:

(1) Fast opening time;
(2) Capability for repetitive pulse operation;
(3) Nondestructive operation;
(4) Low loss in the closed state;
(5) No limitation on time in the closed state; and
(6) Capability for triggering other devices.

These and other objectives are achieved by the present invention through the use of a novel opening switch device which utilizes plasma focus theory. The novel switching device of the present invention includes a conventional dense plasma focus device to which a third or auxiliary electrode has been added. The switching device is utilized in combination with an energy storage inductor and a load. The two functions performed by the novel switch are: (1) it must effectively close so that current can flow in the circuit loop containing the storage inductor; and (2) it must then open by interrupting the charging current so that the energy stored in the inductor can be rapidly discharged through the load.

According to a first preferred embodiment of the subject invention the novel plasma focus switch is effectively closed by establishing an arc discharge between the center electrode of the plasma focus switch (usually the anode) and the auxiliary electrode. This causes a charging current to flow through the energy storage inductor. The polarity of this discharge is such that electrons flow from the center electrode toward the auxiliary electrode. The plasma focus switch is opened through the firing of the plasma focus. By firing the plasma focus after the quasistatic auxiliary discharge (charging circuit) has been established, a dense axially symmetric current sheet is formed which collapses or focuses in the column established by the auxiliary discharge. At maximum compression an anomalous resistivity effect occurs which acts to pinch-off both the plasma focus discharge and the auxiliary discharge thereby abruptly interrupting the charging current flowing through the switch. The energy stored in the inductor is then rapidly discharged through the load.

A second preferred embodiment adds an external axial magnetic field to the plasma focus switch device of the first preferred embodiment. As before the switch is effectively closed by establishing an arc discharge between the auxiliary electrode and the center electrode of the plasma focus switch. Collimation provided by the external magnetic field along the axis of the plasma focus device ensures that the arc is struck only between these two electrodes and that it is axially symmetric. Similarly, the plasma focus switch is opened through the firing of the plasma focus thereby causing the formation of a dense axially symmetric current sheet which collapses or focuses in the column established by the auxiliary discharge. The auxiliary discharge and the external magnetic field embedded in it are compressed, consequently, toward the axis which results in a drastic reduction of the auxiliary discharge current due to the anomalous resistance effect thereby transferring the energy stored in the inductor to the load. The compressed external magnetic field ensures that the auxiliary discharge arc remains along the axis of the center electrode and thus remains subject to the anamalous resistance effect due to the collapsing plasma focus discharge.

There are two primary theoretical reasons for the interruption of the auxiliary discharge current in the plasma focus switch device of the subject invention. It is well known, as discussed above, that the current between the cathode and anode of the plasma focus drops dramatically when the collapsing current sheet undergoes maximum compression and the resistivity of the resulting dense plasma becomes anomalously high. A few nanoseconds after this occurs, electrons with energies exceeding 0.5 MeV are found to stream toward the focus anode. Although the details of that process are not yet well understood, it is evident that strong electric fields directed toward the center electrode with magnitudes on the order of $10^6$ volts/cm are created that accelerate a subdistribution of plasma electrons to those energies. If the plasma focus collapses onto the auxiliary discharge as described above, these same electric fields will decelerate electrons and ions in the auxiliary discharge, and will thereby interrupt the auxiliary discharge current. Viewed in another way, the anomalously high resistivity of the densely compressed plasma that causes a sharp decrease in the plasma focus current will also sharply decrease the auxiliary discharge current that must propagate through the dense plasma. For comparison, it should be noted that plasma focus currents of approximately 600 kA are decreased by as much as 50 percent within tens of nanoseconds, whereas typical auxiliary currents used in inductive energy storage systems may be on the order of tens of kiloamperes.

According to the second theory, a high-energy electron beam can be expected to propagate through a dense plasma parallel to a very strong magnetic field only if its length is less than a critical length $$L_c = \pi V / \omega_p$$

where V is the beam velocity and $\omega_p$ is the plasma frequency of the background plasma. The existence of such a critical length is related directly to the manner in which currents are induced in the plasma by passage of the beam electrons. As the electron beam propagates through the plasma, reverse currents are induced which backstream along the beam channel and provide current neutralization for the beam. In addition, induced currents in the plasma flow radially out of the beam channel to provide charge neutralization for the beam, the extent of which is intrinsically coupled to the degree of current neutralization. If a strong magnetic field is placed parallel to the beam velocity, however, the radial motion of plasma electrons is strongly inhibited. The combination of their backstreaming motion plus this constraint on radial motion causes the plasma electrons to pile up on the beam axis and ultimately halt further beam propagation. The length over which this process takes place, measured relative to the front of the beam, in the critical length, $L_c$.

In the novel plasma focus switch of the present invention, the high energy beam of electrons accelerated by the focus collapse is subject to the critical length limitation. For a typical plasma focus density of $10^{19}$ electrons/cm$^3$, the critical length for that beam is approximately $5 \times 10^{-6}$ m, a distance much smaller than the dimensions of the focus volume. At the very least, this effect will increase the resistivity of the dense plasma and further disrupt the auxiliary discharge current. Although the behavior of the low energy stream of auxiliary discharge electrons is somewhat different from that of a high-energy stream, some of these considerations will also apply to the low-energy stream. Thus the auxiliary discharge electron stream is subject to a modified critical length limitation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 3:
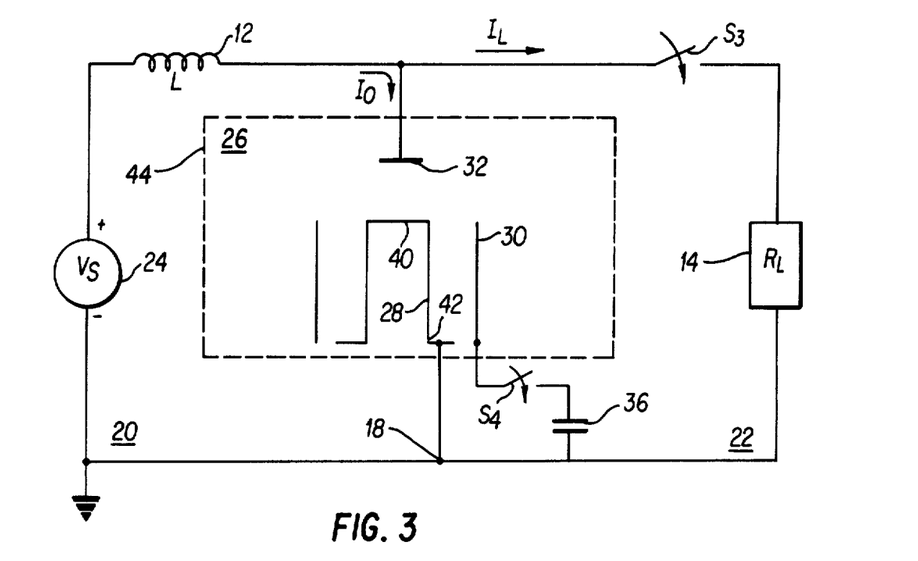
FIG. 3 is a schematic representation of a first preferred embodiment of the plasma focus opening switch device of the subject invention.

Referring now to the drawings, wherein like reference numerals designate identical or corresponding parts throughout the several views, and more particularly to FIG. 3 thereof, an inductive energy storage system incorporating a novel modified plasma focus opening switch according to a first preferred embodiment of the present invention is illustrated.

In FIG. 3, the plasma focus switch, generally designated as reference numeral 26, is shown as including a cylindrical center electrode 28 (usually the anode), having a top surface 40. A cylindrical outer electrode 30 (usually the cathode), surrounds the center electrode 28 and is spaced a distance therefrom. An auxiliary electrode 32 is positioned a distance away from the top surface 40 of the center electrode 28. The auxiliary electrode 32 is the heart of the novel plasma focus switch as will be explained in detail below. The plasma focus switch is positioned within a vacuum chamber 44 which is statically filled with a gas such as hydrogen, deuterium, argone or helium at a typical pressure of 0.1 to 10 TORR.

The charging circuit 20 of the inductive energy storage system of FIG. 3 includes a serially connected inductor 12 and a high current, low voltage dc (or Quasi-DC) source 24 having a voltage $V_s$ coupled between the auxiliary electrode 32 and the center electrode 28 of the plasma focus switch 26 at junctions 16 and 18 respectively. The dc source 24 may be a homopolar device or other suitable current source. Typically such a homopolar device would supply $10^6$ amperes at approximately 50 volts.

A load circuit 22 including a serially connected resistive load 14 having a resistance $R_L$ and a switch $S_3$ is connected between the center electrode 28 and the auxiliary electrode 32.

A trigger circuit for firing the plasma focus switch including a serially connected switch $S_4$ and a charged capacitor 36 is coupled between the outer electrode 30 and the center electrode 28. Switches $S_3$ and $S_4$ are spark discharge type switches or suitable equivalents.

The charging circuit to the plasma focus switch 26 is closed by causing an auxiliary discharge to occur between the auxiliary electrode 32 and the center electrode 28. Initially, the auxiliary discharge is modeled as a simple arc discharge. The voltage required to break down the gap between the auxiliary electrode and the anode of the plasma focus is given by the well known PASCHEN curve and the appropriate Pd product, where P is the pressure in the chamber 44 and d is the electrode separation. As a representative example, the spark potential at 1 TORR of hydrogen and a separation distance of 1 cm is approximately 300 volts. For this modest voltage, breakdown is easily achieved by applying an overvoltage from the voltage source 24, by applying a laser pulse, or by means of an external pulse transformer. Once the gap breaks down, the auxiliary discharge will enter the arc regime if sufficiently large currents are available. In the arc regime, the voltage drop will be approximately 50 to 75 volts and will be almost completely independent of the current flowing between the electrodes. The auxiliary discharge results in a current $I_o$ which flows in the charging circuit including the inductor 12. After a sufficient time has passed, the current $I_o$ will reach a maximum such that maximum energy is stored in the magnetic field of the inductor 12.

The interruption of the inductive charging current by the plasma focus device 26 is initiated by closing switch $S_4$ which connects the capacitor 36 across the outer electrode 30 and the center electrode 28. Capacitor 36 is typically charged to between 10 and 20 kV. The application of a sudden high voltage pulse from the capacitor 36 results in a breakdown between the cathode and the anode in the region of the "breach of the focus" 42 near the base of the center electrode. The breakdown initially occurs in this region because it is the point of lowest inductance in the plasma focus device. A current sheath (not illustrated) then propagates along the length of the center electrode 28, due to magnetic forces, until the plasma focus current sheath reaches the top of the electrode. Shortly after reaching the top of the electrode, which occur approximately 3 microseconds after the initiation of the breakdown by closing switch $S_4$, the resistance of the plasma focus discharge increases by several orders of magnitude. This "anomalous resistance" effect reduces the plasma focus current by 10 to 50 percent. Simultaneously, large electric fields are potentials exceeding hundreds of kilovolts are produced in the plasma column. The direction of these electric fields is such that the auxiliary discharge current flowing between the center electrode 28 and the auxiliary electrode 32 is interrupted or pinched off. Thus, the inductive charging circuit $I_o$ is effectively interrupted by the anomalous resistance phenomenon of the plasma focus device.

In order to transfer the enegy stored in the inductor 12 to the load 14, it is necessary that the switch $S_3$ be closed at the time of the interruption of the auxiliary discharge. As a practical matter switches $S_3$ and $S_4$ can be closed simultaneously.

Figure 4:
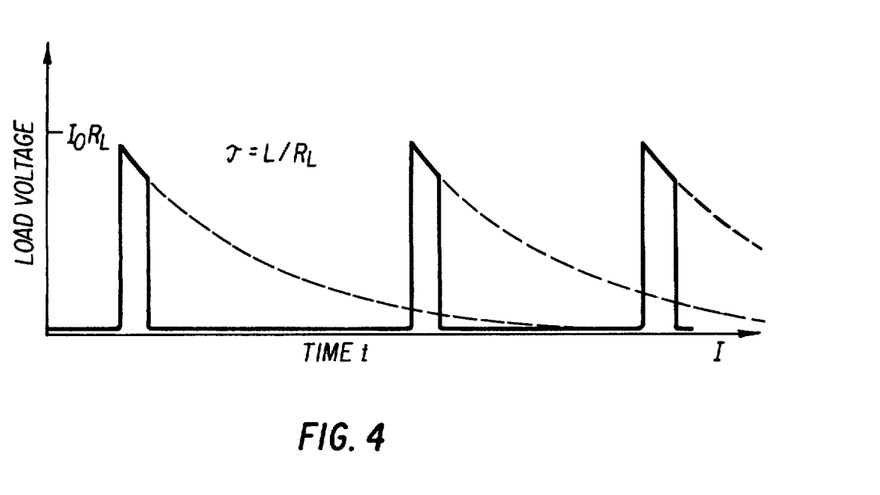
FIG. 4 illustrates the output voltage characteristics of the embodiment of the plasma focus opening switch device shown in FIG. 3 when repetively pulsed.

If, as discussed above, the inductor charging current is interrupted in a time interval much shorter than $L/R_L$, the voltage between the auxiliary electrode and the center electrode will almost instantaneously rise to a voltage approaching $I_oR_L$. FIG. 4 illustrates the auxiliary electrode to center electrode (and the voltage across the load 14) as a function of time. As shown in FIG. 4, the output voltage decays exponentially with the time constant $L/R_L$; however, at a time $\Delta t$ later, the auxiliary discharge may again restrike as the density of the plasma column diminishes. At this time, the inductor charging current again flows and the output voltage drops to a minimal value of 50 to 74 volts. Once the inductor 12 has become recharged and the auxiliary discharge current reaches its maximum value of $I_o$, the plasma focus device can again be fired as shown by the repetitive pulses in FIG. 4. Since the duration of the high density plasma extends for periods of approximately 100 nanoseconds, the "open time" $\Delta t$ is approximately 100 to 200 nanoseconds. The minimum "closed time" of the switch is limited to the time necessary for charging the inductor 12. For applications which do not require repetitive pulses, an additional series switch (not shown) may be inserted in series with the auxiliary electode such that the additional switch latches open upon the interruption of the inductor charging current so as to prevent the re-ignition of the auxiliary discharge.

Figure 5:
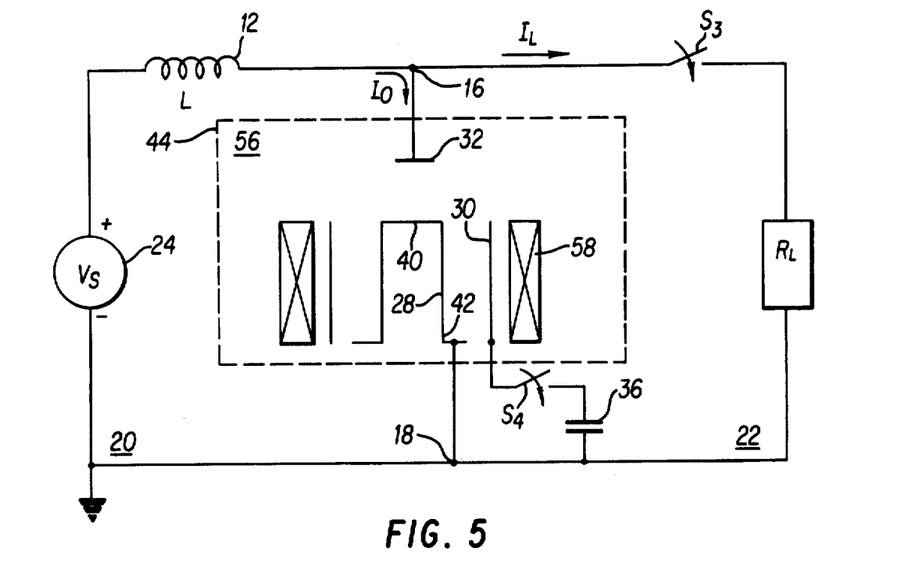
FIG. 5 is a schematic representation of a second preferred embodiment of the plasma focus opening switch device of the subject invention.

FIG. 5 illustrates a second preferred embodiment of the novel plasma focus opening switch according to the present invention. In FIG. 5, the plasma focus switch 56 is similar to the device 26 shown in FIG. 3 with the addition of an electromagnet 58. The remaining elements illustrated in FIG. 5, being unchanged, are identified with the same reference numerals used in FIG. 3.

The electromagnet 58 illustrated as part of the embodiment of FIG. 5, is cylindrical in shape and is positioned to surround the outer electrode 30 and the center electrode 28. This structure produces a magnetic field oriented in the direction of the axis (not illustrated) of the plasma focus switch 56. Alternatively, the electromagnet 58 could be positioned within the structure of the cylindrical center electrode 28. The electromagnet typically produces a magnetic field of 500 GAUSS (0.05 TESLA).

The plasma focus switch 56 is closed by causing an auxiliary discharge to occur between the auxiliary electrode 32 and the center electrode 28. The auxiliary discharge is initiated in the same way as described above with reference to the embodiment shown in FIG. 3. Similarly, the plasma focus switch is opened by initiating a plasma focus discharge between the outer electrode 30 and the center electrode 28 by closing the switch $S_4$. The current sheath (not shown) then propagates along the center electrode 28, due to magnetic forces, until the current sheath reaches the top of the electrode as described above with reference to the embodiment of FIG. 3. However, in the case of the present embodiment, the propagating current sheath acts to compress the magnetic flux from the magnetic field applied by the electromagnet 58. At the moment of peak compression, which occurs approximately 3 microseconds after the initiation of the breakdown by closing switch S$_4$, the magnetic flux becomes compressed into a cylinder with a radius of approximately 1 mm at the axis of the center electrode 28. For the coil configuration and electrode geometry shown in the embodiment of FIG. 5, the flux trapped by the moving plasma is approximated by the product of the peak magnetic field (approximately 500 GAUSS) and the cross-sectional area of the center electrode. For a typical electrode having a diameter of 78 mm, a resultant trapped flux of $2.39 \times 10^{-4}$ Wb is achieved. If all of the trapped magnetic flux is compressed into the 1 mm radius cylinder, a peak axial magnetic field density of $760 \times 10^3$ GAUSS (76 TESLA) is produced.

Figure 6:
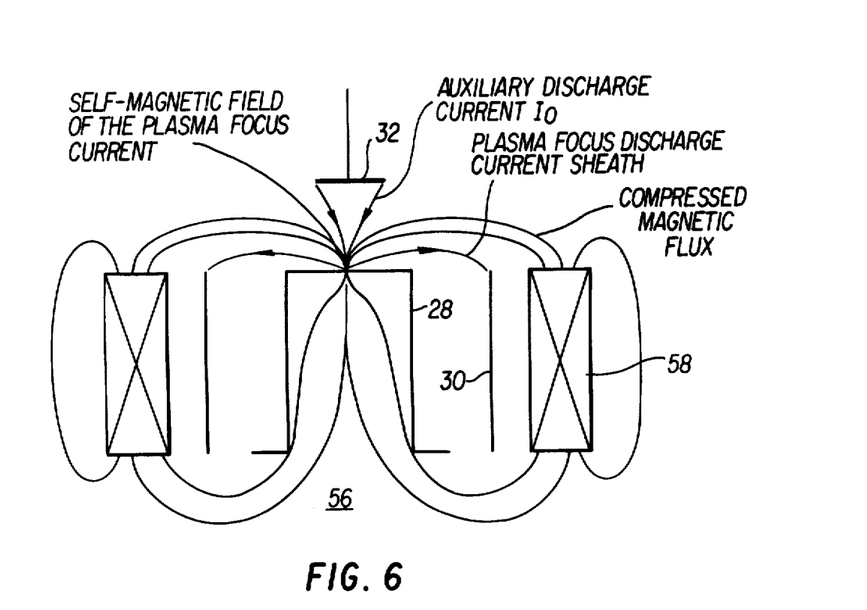
FIG. 6 illustrates the currents and magnetic fields which occur in the embodiment of the plasma focus opening switch device shown in FIG. 5.

FIG. 6 illustrates the currents and magnetic fields existing near the moment of peak compession in the plasma focus device 56 of FIG. 5. A high density plasma with desities exeeding $10^{19}$ electrons/cm$^3$ and temperature exceeding hundreds of electron volts (1 eV corresponds to 11,600 °K) is formed on-axis. Peak currents of approximately 500 kA occur from the plasma focus discharge. Corresponding self-magnetic fields of approximately $10^6$ GAUSS (100 TESLA) are produced in the aximuthal direction.

The auxiliary discharge inductor charging current between the auxiliary electrode 32 and the center electrode 28 is necessarily confined to a small current filament on the axis of the anode because of the intense axial magnetic field produced by the electromagnet 34. As shown in FIG. 6, the auxiliary discharge current is opposite in direction to the plasma focus discharge current.

At the moment of the peak compression of the plasma focus discharge the resistance of the column is greatly increased which acts to reduce the level of the plasma focus discharge current and at the same time acts to interrupt the auxiliary discharge current flowing between the auxiliary electrode 32 and the center electrode 28. The result is that the energy stored in the charged inductor 12 is transferred in the form of a high energy pulse to the load 14 through the switch S$_3$ which is closed at the time of the interruption of the auxiliary discharge as discussed above with reference to FIG. 3.

In the embodiment of the subject invention shown in FIG. 3, the possibility exists that both the auxiliary discharge arc and the plasma focus discharge arc may move to different locations on the top 40 of the center electrode 28 at the onset of the anomolous resistance condition so as to avoid the effect of the increased resistance. However, in the case of embodiment of FIG. 5, both discharge currents are restricted to one location by the compressed magnetic field and thus are unable to avoid the anomalous resistance effect.

In each of the embodiments of the subject invention shown in FIGS. 3 and 5, charged particle beams are ejected from the plasma focus device at the onset of current interruption. These particle beams may be used to simultaneously trigger other plasma focus devices or other switches as desired.

Theoretically, the plasma focus switch devices described herein should be capable of conservatively interrupting an inductive charging current which is approximately one fourth the peak plasma focus current. Thus the interruption of currents in the hundreds of kiloamperes may be possible. Also, during the interrupt cycle, the plasma focus discharge should be capable of holding off voltages possibly as large as 500 kilovolts.

Since the inductance of the plasma focus switch is much less than that of the energy storage inductance, the energy of the plasma focus will ideally represent only a small fraction of the total energy of the system.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A device for interrupting current flow in a circuit including a high-amperage current source, comprising:
   a cylindrical center electrode coupled to a first terminal of said circuit including said high-amperage current source;
   a cylindrical outer electrode surrounding said center electrode, said outer electrode being concentric with said center electrode and spaced a first distance thereform;
   an auxiliary electrode located a second distance from said center electrode, said auxiliary electrode being coupled to a second terminal of said circuit including said high-amperage current source;
   an envelope surrounding said center electrode, said outer electrode, and said auxiliary electrode;
   means for initiating an auxiliary arc discharge between said auxiliary electrode and said center electrode, said auxiliary arc discharge producing a flow of current from said circuit including said high-amperage current source through said current interrupting device; and
   pulse generating means coupled between said anode and said cathode for supplying a high voltage pulse between said center electrode and said outer electrode, said high voltage pulse initiating a plasma focus arc discharge between said center electrode and said outer electrode;
   whereby said plasma focus arc discharge occurring between said outer electrode and said center electrode moves toward the axis of said center anode at the surface of said center electrode adjacent to said auxiliary electrode due to magnetic forces and said plasma focus arc discharge produces an enhanced resistance effect between said center electrode and said outer electrode, said enhanced resistance effect producing a reduction in said plasma focus arc discharge and said auxiliary arc discharge;
   whereby said current flowing from said circuit including said high-amperage current source through said current interrupting device is interrupted.

2. A device for interrupting current as recited in claim 1, which further comprises:
   means for producing and axial magnetic field, said magnetic field having an axis which coincides with a central axis of said cylindrical center electrode.

3. A device for interrupting current as recited in claim 2, wherein said means for producing an axial magnetic field comprises:
   a cylindrical electromagnet, said electromagnet being concentric with said cylindrical anode.

4. A device for interrupting current as recited in claim 3, wherein:
   said cylindrical electromagnet surrounds said outer electrode and is spaced a third distance therefrom.

5. A device for interrupting current as recited in claim 3, wherein:

said cylindrical electromagnet is located within said cylindrical center electrode.

6. A device for interrupting current as recited in claim 1, wherein:
said envelope is filled with a gas selected from the group consisting of hydrogen, deuterium, helium, and argon.

7. A device for interrupting current as recited in claim 6, wherein:
said gas is under a pressure lying in the range of 0.1 to 10 TORR.

8. A device for interrupting current as recited in claim 1, wherein said means for initiating an auxiliary arc discharge comprises:
a laser, said laser directing a pulse of coherent light in the vicinity of said auxiliary electrode and said center electrode.

9. A device for interrupting current as recited in claim 1, wherein said means for initiating an auxiliary arc discharge comprises:
a trigger electrode located adjacent to said auxiliary electrode and said center electrode; and
pulse transformer means coupled to said trigger electrode for supplying a high voltage pulse to said trigger electrode.

10. A device for interrupting current as recited in claim 1, wherein said pulse generating means comprises:
a capacitor, said capacitor being charged to a high voltage; and
switching means coupled in series with said capacitor for selectively coupling said capacitor between said center electrode and said outer electrode;
whereby said electric charge stored in said capacitor is selectively applied across said center electrode and said outer electrode.

11. A device for switching current as recited in claim 1, wherein said high-amperage current source comprises:
a homopolar generator.

12. An inductive energy storage system for supplying a high-energy electrical pulse to a load, said system comprising:
a high-amperage current source including first and second terminals;
an inductor including first and second terminals, said first terminal of said inductor being coupled to a first terminal of said current source;
plasma focus switch means including first and second terminals, a plasma focus device having a center and outer electrode with said center electrode connected to said second terminal of said plasma focus switch means, an auxiliary electrode connected to said first terminal of said plasma focus switch means for controlling the flow of current between said first and second terminals of said plasma focus switch means, said first terminal of said plasma focus switch means being coupled to said second terminal of said inductor, said second terminal of said plasma focus switch means being coupled to said second terminal of said current source and to a first terminal of said load with said first terminal of said plasma switch focus means being coupled to a second terminal of said load;
means for closing said plasma focus switch means whereby when said plasma focus switch is closed a current flows from said current source through said inductor thereby storing energy in said inductor and whereby a current flowing through said auxiliary electrode is interrupted due to a plasma pinch.

13. An inductive energy storage system as recited in claim 12, wherein said plasma focus switch means comprises:
a cylindrical center electrode coupled to said second terminal of said plasma focus switch means;
a cylindrical outer electrode surrounding said center electrode, said outer electrode being concentric with said center electrode spaced a first distance therefrom;
an auxiliary electrode located a second distance from said center electrode, said auxiliary electrode being coupled to said first terminal of said plasma focus switch means;
an envelope surrounding said anode, said cathode, and said auxiliary electrode;
means for initiating an auxiliary arc discharge between said auxiliary electrode and said center electrode, said auxiliary arc discharge producing a flow of current between said first and second terminals of said plasma focus switch means from said current source;
pulse generating means coupled between said center electrode and said outer electrode for supplying a high voltage pulse between said center electrode and said outer electrode, said high voltge pulse initiating a plasma focus arc discharge between said center electrode and said outer electrode;
whereby said plasma focus arc discharge occurring between said center electrode and said outer electrode moves toward said center electrode due to magnetic forces and said plasma focus arc discharge produces an enhanced resistance effect between said center electrode and said outer electrode, said enhanced resistance effect causing a reduction in said plasma focus arc discharge and said auxiliary arc discharge;
whereby said current flowing from said current source through said first and second terminals of said plasma focus switch means is interrupted.

14. An inductive energy storage system as recited in claim 13, wherein said plasma focus switch means further comprises:
means for producing and axial magnetic field, said magnetic field having an axis which coincides with a central axis of said cylindrical center electrode.

15. An inductive energy storage system as recited in claim 14, wherein said means for producing and axial magnetic field comprises:
a cylindrical electromagnet, said electromagnet being concentric with said cylindrical center electrode.

16. An inductive energy storage system as recited in claim 15, wherein:
said cylindrical electromagnet surrounds said outer electrode and is spaced a third distance therefrom.

17. An inductive energy storage system as recited in claim 15, wherein:
said electromagnet is located within said cylindrical center electrode.

18. An inductive energy storage system as recited in claim 13, wherein:
said envelope is filled with a gas selected from the group consisting of hydrogen, deuterium, helium, and argon.

19. An inductive energy storage system as recited in claim 13, wherein:

said gas is under a pressure lying in the range of 0.1 to 10 TORR.

20. An inductive energy storage system as recited in claim 13, wherein said means for initiating an auxiliary arc discharge comprises:
   a laser, said laser directing a pulse of coherent light in the vicinity of said auxiliary electrode and said center electrode.

21. An inductive energy storage system as recited in claim 13, wherein said means for initiating an auxiliary arc discharge comprises:
   a trigger electrode located adjacent to said auxiliary electrode and said center electrode; and
   pulse transformer means coupled to said trigger for supplying a high voltage pulse to said trigger electrode.

22. An inductive energy storage system as recited in claim 13, wherein said pulse generating means comprises:
   a capacitor, said capacitor being charged to a high voltage; and
   capacitor switching means coupled in series with said capacitor for selectively coupling said capacitor between said center electrode and said outer electrode;
   whereby said electric charge stored in said capacitor is selectively applied across said center electrode and said outer electrode.

23. An inductive energy storage system as recited in claim 12, wherein said high-amperage current source comprises:
   a homopolar generator.

24. An inductive energy storage system as recited in claim 12 further comprising:
   second switch means coupled between said first terminal of said plasma focus switch means and and second terminal of said load for selectively coupling said load in parallel with said plasma focus switch means;
   whereby said plasma focus switch means is opened with the closing of said second switch means thereby transferring the magnetic energy stored in said conductor to said load in the form of a high-energy pulse.

* * * * *